United States Patent
Cox

[19]

[11] Patent Number: 6,015,463
[45] Date of Patent: Jan. 18, 2000

[54] METHOD AND SYSTEM FOR TRAPPING CONTAMINANTS FORMED DURING CHEMICAL VAPOR DEPOSITION PROCESSING OF SEMICONDUCTOR WAFERS

[75] Inventor: Arthur Leo Cox, Buda, Tex.

[73] Assignee: Advanced Micro Devices, Inc., Sunnyvale, Calif.

[21] Appl. No.: 08/801,081

[22] Filed: Feb. 14, 1997

[51] Int. Cl.[7] .................................................. C23C 16/00
[52] U.S. Cl. ........................................... 118/715; 156/345
[58] Field of Search ................... 118/715, 724; 156/345

[56] References Cited

U.S. PATENT DOCUMENTS 5,062,771  11/1991  Satou ...................................... 417/210
5,114,683   5/1992  Hirase .................................... 422/173
5,250,092  10/1993  Nakano ................................... 96/136
5,422,081   6/1995  Miyagi ................................... 422/170

*Primary Examiner*—R. Bruce Breneman
*Assistant Examiner*—Erin Fieler
*Attorney, Agent, or Firm*—Kevin L. Daffer; Conley, Rose & Tayon

[57] ABSTRACT

A chemical vapor deposition system is provided. The chemical vapor deposition system is used to deposit an inorganic layer on a silicon wafer. The chemical vapor deposition system includes a reactor chamber, a particle trap, a gate valve, and a vacuum system. The vacuum system forces a gas out of the reactor chamber and through the particle trap and the gate valve. When the gate valve opens and closes, particles inside the valve can contaminate the reactor chamber and the vacuum system. The particle trap has a reservoir in which particles in the gas may become trapped before they reach the gate valve. The particle trap helps prevent the particles from becoming trapped in the gate valve.

20 Claims, 3 Drawing Sheets

METHOD AND SYSTEM FOR TRAPPING CONTAMINANTS FORMED DURING CHEMICAL VAPOR DEPOSITION PROCESSING OF SEMICONDUCTOR WAFERS

BACKGROUND OF THE INVENTION

1. Field of the Invention

This present invention relates to coating semiconductor wafers during a chemical vapor deposition ("CVD") process and more specifically to trapping particles contained within a gas which forms the CVD material.

2. Description of the Related Art

One step in manufacturing an integrated circuit involves growing an inorganic layer on a flat silicon wafer. A low temperature method known as chemical vapor deposition may be used in which a gas containing reactive substances such as, for example, silane and oxygen flows into a reactor chamber. The reactive substances absorb or precipitate onto the top surface of the wafer. Then the substances react to form the desired inorganic layer. In order for the reactions to occur, the top surface of the wafer may have to be bombarded by a plasma. This plasma bombardment is typically caused by an electric potential created in the chamber. The plasma aids the reaction because the plasma's kinetic energy is transferred to an activation energy which is required for the reaction.

Gas which contains by-products is removed from the reactor chamber after CVD is performed in order to prevent undesirable reactions from occurring in a later chemical vapor deposition. In one CVD system, deemed Concept One manufactured by Novellus Systems Inc., gas is forced out of the reactor chamber by a vacuum system until the pressure in the reactor chamber falls to approximately 1000 mTorr.

FIG. 1 illustrates a side view of a portion of the Concept One CVD system. Specifically, an outlet conduit 2 for a reactor chamber 1a is presented. The outlet conduit 2 includes an exhaust box 1b through which a gas may pass from the reactor chamber 1a to a throttle valve 3. Downstream of the throttle valve 3 is a four inch gate valve 5. A four inch vacuum manifold 7 is disposed within the outlet conduit 2 downstream of the gate valve 5. Flanges such as four inch flange 4 mount all the objects disposed within the outlet conduit 2 to each other. Sealing gaskets such as o-ring 6 help prevent gas leakage from the outlet conduit 2.

The vacuum manifold 7 generally forces gas out of the reactor chamber 1a before a new gas can pass into the chamber 1a. The throttle valve 3 may maintain a steady pressure in the reactor chamber 1a when the new gas enters the chamber 1a by partially closing. When the throttle valve 3 partially closes, the vacuum manifold 7 cannot draw as much gas per time from the chamber 1a. The gate valve 5 may control the passage of gas into the vacuum manifold from the reactor chamber 1a.

When reacting substances during a chemical vapor deposition to form a layer of a silicon containing compound on a wafer, a powdery silicon by-product also forms. Hereafter the silicon by-product will be referred to as particles or contaminants. If not properly expelled, powdery particles become mixed in the gas when the gas is forced from the reactor chamber 1a. The gate valve 5 is oriented such that its body extends below the outlet conduit 2. Particles are forced by gravity into the bottom of the valve's body as the gas passes through the gate valve 5.

The opening and closing of the gate valve 5 stirs up (or disrupts) the particles, causing them to contaminate the reactor chamber 1a and the vacuum manifold 7. When particles are present in the reactor chamber 1a during a CVD operation, the inorganic layer tends to not grow uniformly across the wafer surface. Defects in the layer create problems when performing the subsequent steps in integrated circuit manufacturing. When particles enter the vacuum manifold 7, they contact turbine vanes located within pumps of the vacuum system. Since the turbine vanes are at a close tolerance with the pump walls, particles and other contaminants can inhibit the operation of the vanes. The presence of particles in the vicinity of the turbine vanes tends to shorten the life of the pumps.

Cleaning the particles from the body of gate valve 5 becomes necessary but is difficult. It requires shutting down the vacuum manifold 7, opening a service port located at the bottom of the gate valve 5, and removing the particles from the inner portion of the gate valve 5. One drawback to this is that the vacuum manifold 7 has dry pumps in which no oil lubricates the turbine vanes within the pumps. Thus, it is difficult to restart the pumps after shutting them down.

It is therefore desirable that a CVD system be devised which reduces the presence of particles and contaminants in vacuum equipment and on wafers. Further, it is desirable that such particles be removed from the system without shutting down the vacuum system pumps. A CVD system with these features would reduce contamination to the reactor chamber and the vacuum system. The natural result of reduced contamination is higher wafer yields and a more reliable wafer product.

SUMMARY OF THE INVENTION

The problems outlined above are in large part solved by the present invention. An embodiment of the invention relates to a chemical vapor deposition system which preferably includes a reactor chamber in which reactive substances such as silane and oxygen within a gas may react to form an inorganic layer or film on wafers. The system further preferably includes a particle trap located in an outlet conduit of a reactor chamber between a throttle valve and a gate valve. The gate valve is preferably located downstream of the particle trap. A vacuum system is preferably located in the outlet conduit downstream of the gate valve. The vacuum system preferably forces a gas from the reactor chamber and through the outlet conduit.

The particle trap preferably extends below the outlet conduit and forms a reservoir for collecting the particles. The particles are forced by gravity into the trap body as the gas passes through the particle trap. The gate valve is preferably oriented with its body and gate extending above the outlet conduit instead of below the center line of the conduit. This orientation advantageously prevents any particles that are not trapped in the particle trap from becoming trapped in the gate valve.

An advantage of the invention is that particles may be trapped in the particle trap and not the gate valve; therefore, the particles will not contaminate the reactor chamber and the vacuum system when the gate valve opens and closes. Another advantage is that the vacuum system will not need to be shut down for cleaning the particle trap because the gate valve may be closed during the cleaning.

BRIEF DESCRIPTION OF THE DRAWINGS

Further advantages of the present invention will become apparent to those skilled in the art upon reading the following description of the preferred embodiments and upon reference to the accompanying drawings in which.

Figure 1:
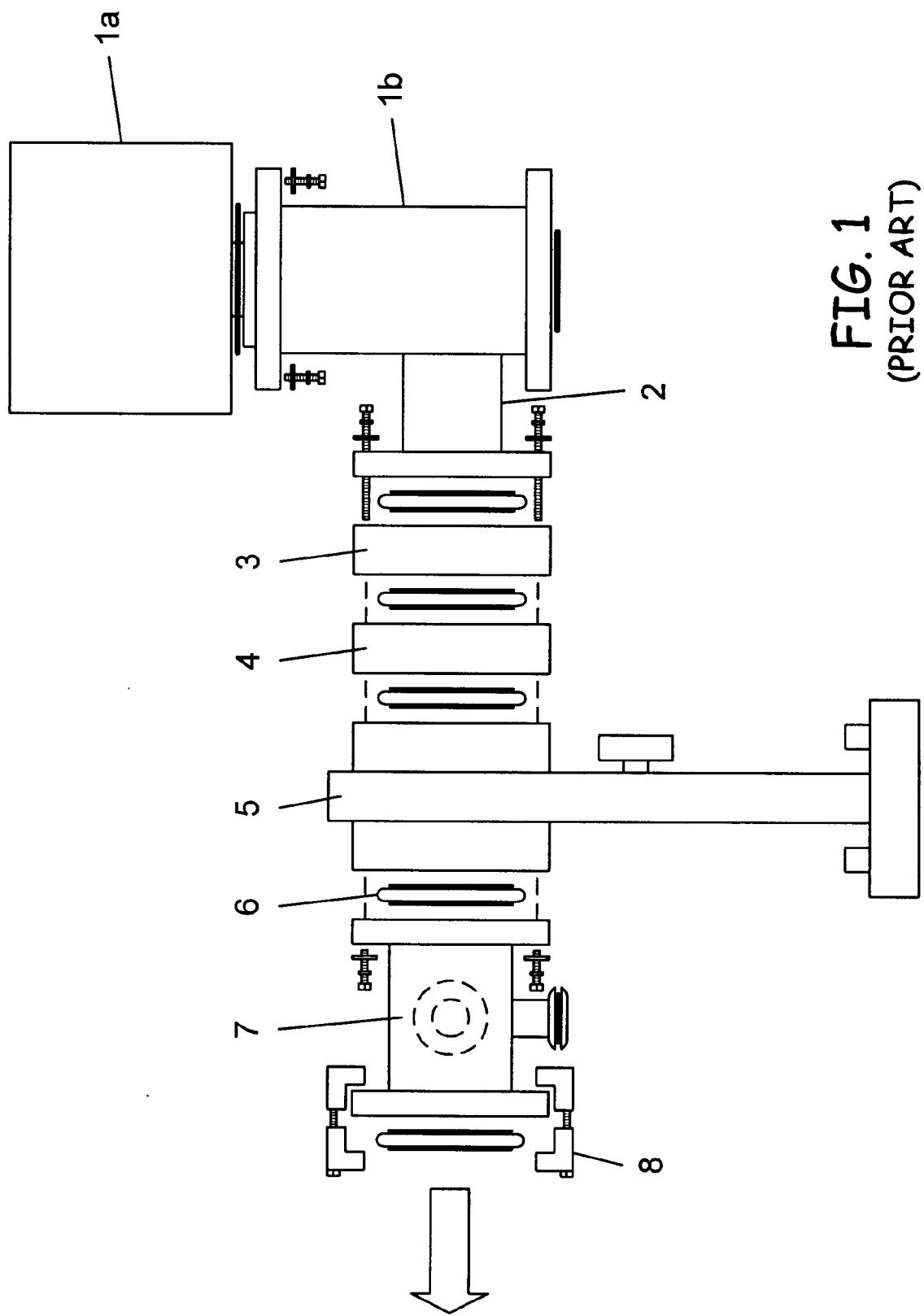
FIG. 1 is a front side view of the outlet conduit of a reactor chamber in a conventional chemical vapor deposition system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
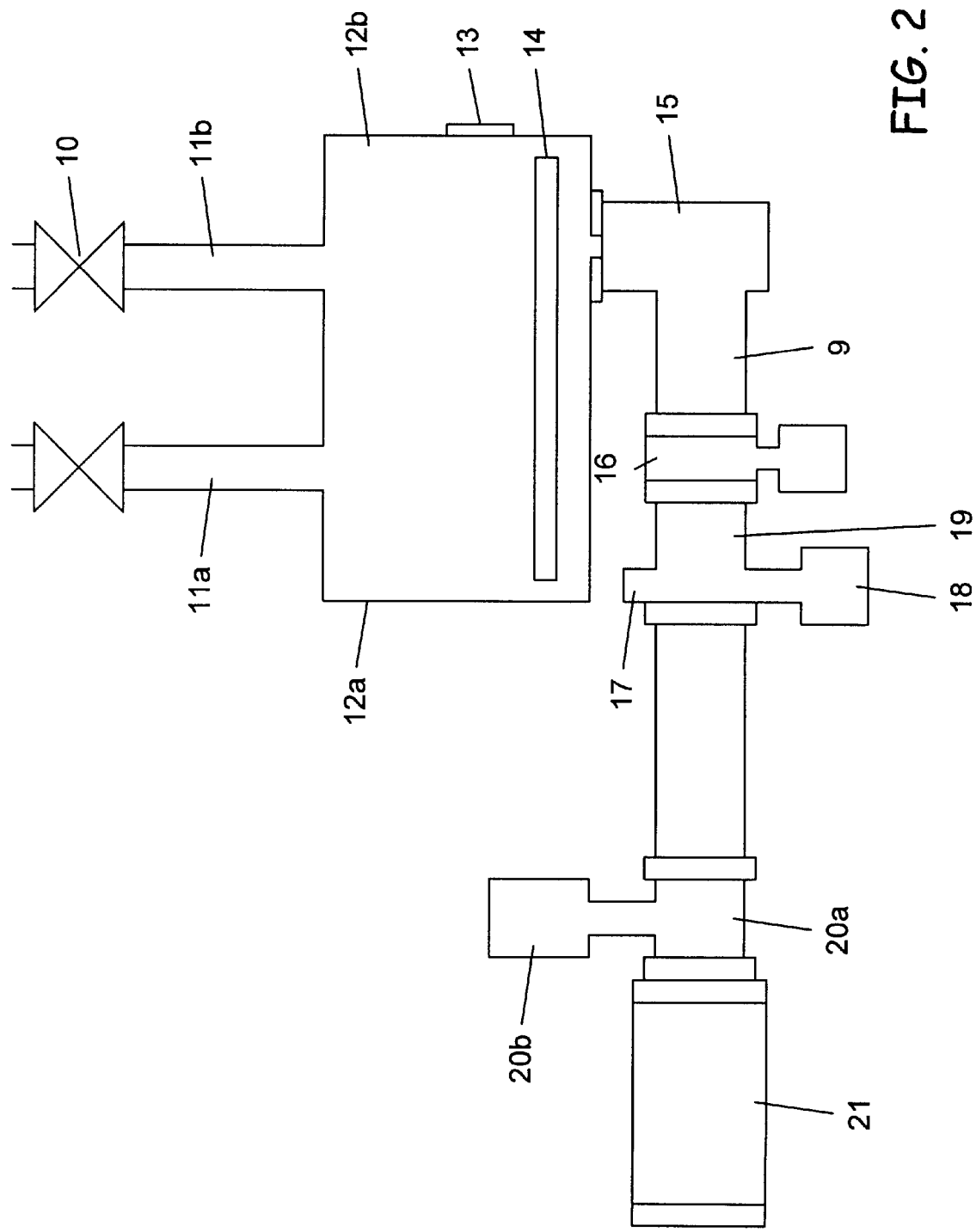
FIG. 2 is a side plan view of a chemical vapor deposition system according to the present invention.

Turning now to the drawings, FIG. 2 illustrates a side plan view of a chemical vapor deposition system. It represents one embodiment of the present invention. The chemical vapor deposition system preferably includes inlet conduits 11a and 11b which allow gas to pass through inlet openings into the reactor chamber 12a. Reactor chamber 12a preferably surrounds a vapor space 12b in which the chemical vapor deposition takes place. Reactor chamber 12a preferably includes a removable closure 13. The closure 13 may be removed to allow access to the reactor chamber 12a through a loading opening for wafers. Disposed within reactor chamber 12a is a wafer holder 14. Wafers may be loaded into reactor chamber 12a and placed on wafer holder 14 for processing.

The chemical vapor deposition chamber also preferably includes an outlet conduit 9 through which gas may exit an outlet opening in the reactor chamber 12. Outlet conduit 9 preferably includes an exhaust box 15 and a throttle valve 16 downstream from exhaust box 15. A particle trap 17 is preferably disposed within outlet conduit 9 downstream of throttle valve 16, and a gate valve 20a is preferably located downstream of the particle trap 17. Outlet conduit 9 further preferably includes a vacuum system 21 downstream of gate valve 20a. The elongated part 20b of gate valve 20a preferably extends above outlet conduit 9 to avoid trapping particles that have possibly escaped from particle trap 17. However, the elongated part 20b of gate valve 20 could also extend below outlet conduit 9, but this orientation of gate valve 20a may increase the amount of particles that collect in valve 20a. The particles could then contaminate the reaction chamber 12a.

Figure 3A:
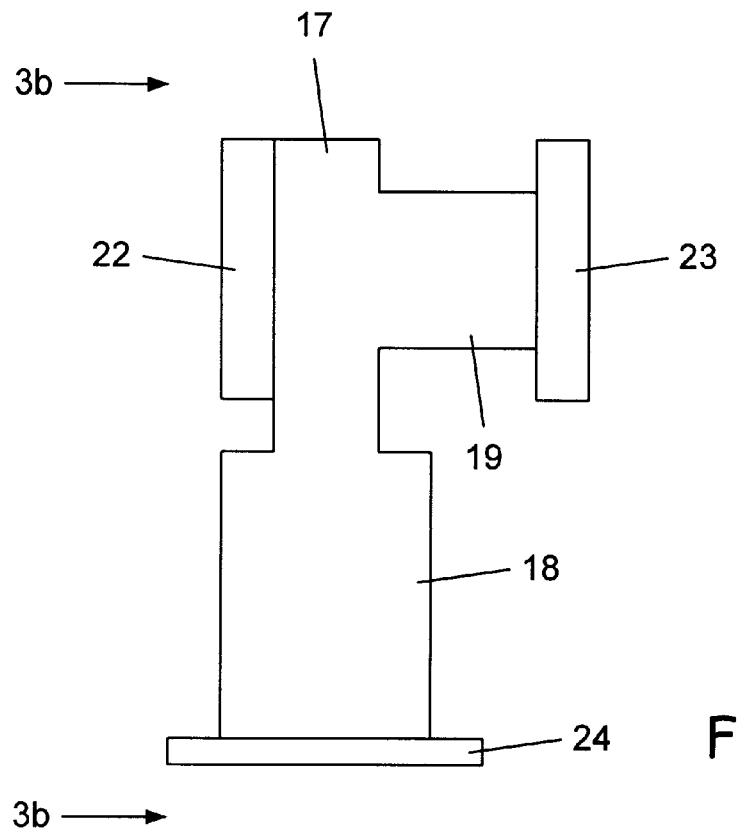
FIG. 3a is a side elevation view of a particle trap which is part of the chemical vapor deposition system.

FIG. 3a exhibits the preferred embodiment of particle trap 17. Particle trap 17 preferably extends below outlet conduit 9 to form a reservoir 18. Gravity preferably forces particles passing through particle trap 17 into reservoir 18. Particle trap 17 also preferably extends in a direction parallel to outlet conduit 2 to form a spacer 19. Flange 23 preferably mounts spacer 19 to throttle valve 16. Opposite to flange 23 on the other side of particle trap 17, flange 22 preferably mounts particle trap 17 to outlet conduit 9. A service port cap 24 preferably covers an opening at the lower end of reservoir 18. Service port cap 24 may be removed to clean particles from reservoir 18. FIG. 3a also shows that flange 22 is preferably mounted flush with particle trap 17.

Figure 3B:
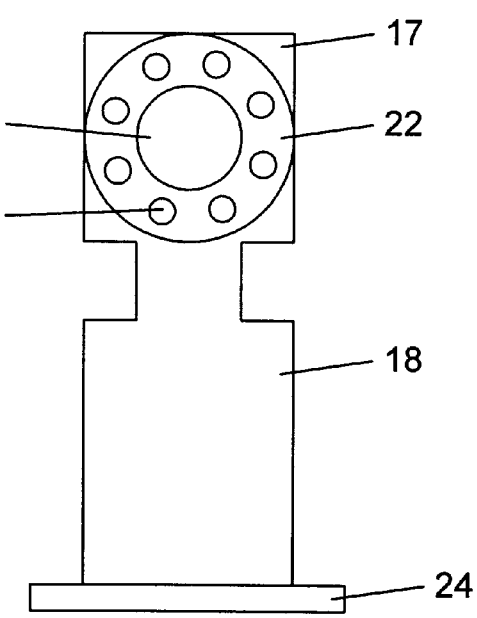
FIG. 3b is an elevation view along axis 3b of FIG. 3a showing a flange which mounts the particle trap to a conduit.

Turning to FIG. 3b, a cross-section along plane 3b in FIG. 3a shows an opening 25 in a side of particle trap 17 and in flange 22. Opening 25 preferably creates a passage for gas. Holes 26 preferably allow flange 22 to be bolted to particle trap 17 on one side and to outlet conduit 9 on the other side.

Various modifications may be made to the preferred chemical vapor deposition. For example, in an embodiment a particle trap for the chemical vapor deposition system may be formed from the body of an "empty gate valve". The sliding plate which, when closed, prevents fluid from passing through the valve may be removed to form the "empty gate valve". Gate valves like model no. 14040-PE34 manufactured by VAT Inc. in Switzerland are preferably used because they have an elongated body which may extend below the conduit to which the gate valve is attached. The elongated body may trap particles before they are able to reach gate valve in the system.

In an embodiment, the particle trap is maintained at a predetermined temperature below ambient temperature, thereby promoting the gas's reactive substances to react and form the particles. The temperature of the particle trap may be maintained with a cooling system. The cooling system may include a conduit which coils around the particle trap. A coolant such as water at 15 degrees Celsius may be passed through the coils to cool the gas within the particle trap. The particles which form may then be collected in the trap body. The substances that react to form the particles are preferably consumed in the particle trap so that additional particles do not form anywhere upstream from the particle trap.

EXAMPLE

The number of defects per squared centimeter on wafers that had undergone chemical vapor deposition on a Concept One were compared to the number of defects per squared centimeter on wafers that had undergone chemical vapor deposition on an improved Concept One. FIG. 1 illustrates a side view of a portion of the Concept One which was used in this test. The Concept One included an outlet conduit for a reactor chamber. The outlet conduit included an exhaust box through which a gas could pass from the reactor chamber to a throttle valve. Downstream of the throttle valve was a four inch gate valve. The valve's body was oriented to extend below the outlet conduit. A four inch vacuum manifold for forcing a gas out of the reactor chamber was disposed within the outlet conduit downstream of the gate valve.

Particles which became trapped in the Concept One's gate valve were removed every 90 days. The vacuum system had to be shut down before removing the particles, and the vacuum system was difficult to start back up. Cleaning the particles out of the system more frequently was desired but not performed since shutting down the vacuum system was avoided if possible.

The number of defects or particles per square centimeter was determined on two wafers daily for three months. These wafers were processed using the Concept One. The average number of defects per square centimeter was found to be 0.38.

The Concept One was then altered to test the present invention. A particle trap was created from an "empty valve body" as mentioned above. The particle trap was placed in the outlet conduit of the reactor chamber downstream of the throttle valve. The gate valve was moved downstream of the particle trap, and its elongated body was oriented above the outlet conduit instead of below. Particles which became trapped in the particle trap were removed every 30 days and did not require the shut down of the vacuum system since the gate valve could be closed during the removal.

The number of defects per square centimeter was determined on two wafers daily for a year after the Concept One had been improved. The average number of defects per square centimeter were 0.35 after three months, 0.23 after six months, 0.18 after nine months, and 0.16 after twelve months. Therefore, the average number of defects per squared centimeter continuously dropped after the changes had been made to the Concept One. The improved Concept One demonstrates that the present invention works well to continuously provide a lower number of defects per square centimeter on wafers than conventional chemical vapor deposition systems.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system for performing a chemical vapor deposition, comprising:
    a reactor chamber comprising:
        a wafer holder disposed within the reactor chamber;
        an inlet opening for accepting a gas into the reactor chamber;
        a loading opening for loading wafers into the reactor chamber; and
        an outlet opening for expelling the gas from the reactor chamber;
    an inlet conduit communicating with the inlet opening, thereby allowing the gas to enter the reactor chamber;
    an outlet conduit communicating with the outlet opening, thereby allowing the gas to exit the reactor chamber;
    a valve disposed within the outlet conduit for controlling movement of the gas through the outlet conduit; and
    a particle trap disposed within the outlet conduit between the valve and the reactor chamber, the particle trap comprising an empty valve body that includes a reservoir for collecting particles.

2. The system as recited in claim 1, wherein the reactor chamber further comprises a removable closure for preventing the gas from exiting the reactor chamber through the loading opening, the closure being disposed within the loading opening.

3. The system as recited in claim 1, further comprising a valve disposed within the inlet conduit for controlling movement of the gas into the reactor chamber.

4. The system as recited in claim 1, wherein the reservoir extends below the outlet conduit.

5. The system as recited in claim 1, wherein the particle trap further comprises a removable service port cap for allowing access to an interior portion of the particle trap.

6. The system as recited in claim 1, wherein the particle trap further comprises a removable service port cap located on a lower end of the reservoir.

7. The system as recited in claim 1, wherein the particle trap further comprises side openings located on opposite sides of the particle trap for passage of the gas into and out of the particle trap.

8. The system as recited in claim 1, further comprising a throttle valve disposed within the outlet conduit between the reactor chamber and the particle trap, and wherein the particle trap further comprises a flange for mounting the throttle valve to the particle trap, the flange comprising a first side and a second side, the first side being proximate the throttle valve, the second side connecting to the particle trap.

9. The system as recited in claim 1, wherein the particle trap further comprises a flange for mounting the particle trap to the outlet conduit, the flange comprising a first side and a second side, the first side connecting to the particle trap, the second side connecting to the outlet conduit.

10. The system as recited in claim 1, wherein the valve extends above the outlet conduit to inhibit the particles from becoming trapped within the valve.

11. A method for removing particles from a chemical vapor deposition system, comprising:
    passing a gas comprising reactive substances into the reactor chamber, thereby promoting formation of a product layer on a wafer disposed within the reactor chamber;
    passing the gas from the reactor chamber through an outlet conduit, the outlet conduit comprising a particle trap for collecting particles entrained within the gas, the particle trap comprising an empty valve body that includes a reservoir for collecting particles, the reservoir extending below the outlet conduit with a removable service port cap for allowing ingress into the reservoir; and
    removing particles from the reservoir via the removable service port cap.

12. The method as recited in claim 11, wherein the particles are forced by gravity into the reservoir.

13. The method as recited in claim 11, wherein the removable service port cap is located at a lower end of the reservoir.

14. The method as recited in claim 11, further comprising operating a vacuum system to force the gas out of the reactor chamber, and wherein the outlet conduit further comprises a gate valve disposed between the vacuum system and the particle trap, and further comprising removing the service port cap to remove the particles while the gate valve is closed and the vacuum manifold is operating.

15. The method as recited in claim 11, wherein the reactive substances form the particles, the particles comprising silicon.

16. The method as recited in claim 11, wherein the particle trap is maintained at a predetermined temperature below ambient temperature, thereby promoting the reactive substances to react to form the particles while the reactive substances are within the particle trap.

17. The method as recited in claim 11, further comprising passing the gas from the particle trap to a vacuum system, the vacuum system having turbine vanes for positively displacing the gas from one side of the vacuum system to another side of the vacuum manifold.

18. The system as recited in claim 1, further comprising a cooling system to maintain the particle trap at a predetermined temperature below ambient temperature.

19. The system as recited in claim 18, wherein the cooling system comprises a conduit, which coils around the particle trap, through which a coolant flows.

20. The method as recited in claim 17, wherein the particle trap is maintained at the predetermined temperature below ambient temperature by flowing a coolant through a conduit that coils around the particle trap.

* * * * *

UNITED STATES PATENT AND TRADEMARK OFFICE
CERTIFICATE OF CORRECTION

PATENT NO. : 6,015,463
DATED : January 18, 2000
INVENTOR(S) : Arthur Leo Cox

It is certified that error appears in the above-identified patent and that said Letters Patent is hereby corrected as shown below:

Claim 20, col. 6, line 62, after the phrase "as recited in claim" please delete "17" and substitute therefor --16--.

Signed and Sealed this

Twenty-third Day of January, 2001

Attest:

Q. TODD DICKINSON

*Attesting Officer*

*Commissioner of Patents and Trademarks*